(12) United States Patent
Im et al.

(10) Patent No.: US 11,081,673 B2
(45) Date of Patent: *Aug. 3, 2021

(54) REFLECTIVE DISPLAY DEVICE

(71) Applicant: LG Display Co., Ltd., Seoul (KR)

(72) Inventors: Jonghyeok Im, Busan (KR); SeJune Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 105 days.

This patent is subject to a terminal disclaimer.

(21) Appl. No.: 16/547,481

(22) Filed: Aug. 21, 2019

(65) Prior Publication Data
US 2019/0379005 A1 Dec. 12, 2019

Related U.S. Application Data

(63) Continuation of application No. 15/167,692, filed on May 27, 2016, now Pat. No. 10,476,034.

(30) Foreign Application Priority Data

Dec. 15, 2015 (KR) .................. 10-2015-0178962

(51) Int. Cl.
*H01L 51/52* (2006.01)
*H01L 27/32* (2006.01)
*H01L 27/12* (2006.01)

(52) U.S. Cl.
CPC ........ *H01L 51/5265* (2013.01); *H01L 27/322* (2013.01); *H01L 27/3246* (2013.01); *H01L 27/3258* (2013.01); *H01L 27/3262* (2013.01); *H01L 51/5212* (2013.01); *H01L 51/5253* (2013.01); *H01L 51/5271* (2013.01); *H01L 27/1248* (2013.01); *H01L 27/3244* (2013.01); *H01L 2251/301* (2013.01); *H01L 2251/558* (2013.01)

(58) Field of Classification Search
None
See application file for complete search history.

(56) References Cited

U.S. PATENT DOCUMENTS

| 6,104,459 A | 8/2000 | Oike et al. |
| 9,000,665 B2 | 4/2015 | Yoo et al. |
| 2007/0090754 A1 | 4/2007 | Li et al. |
| 2012/0228603 A1 | 9/2012 | Nakamura |

(Continued)

FOREIGN PATENT DOCUMENTS

CN 103325811 A 9/2013

OTHER PUBLICATIONS

United States Office Action, U.S. Appl. No. 15/167,692, dated Sep. 27, 2018, 18 pages.

(Continued)

*Primary Examiner* — Steven B Gauthier
(74) *Attorney, Agent, or Firm* — Fenwick & West LLP

(57) ABSTRACT

A reflective display device provided with an optical layer which is capable of improving adhesion between a substrate and a reflective layer and controlling a color of reflected light is disclosed. The reflective display device includes first and second substrates facing each other, each of which includes a display area and a reflective area; a display element provided in the display area; a reflective layer provided in the reflective area and arranged on one surface of the second substrate to reflect incident light; and an optical layer arranged between the second substrate and the reflective layer.

17 Claims, 7 Drawing Sheets

(56) References Cited

U.S. PATENT DOCUMENTS

| | | |
|---|---|---|
| 2013/0249383 A1 | 9/2013 | Yoo et al. |
| 2014/0183479 A1 | 7/2014 | Park et al. |
| 2014/0183501 A1 | 7/2014 | Kim et al. |
| 2016/0155789 A1 | 6/2016 | Kim et al. |
| 2016/0164033 A1 | 6/2016 | Moon et al. |

OTHER PUBLICATIONS

United States Office Action, U.S. Appl. No. 15/167,692, dated May 17, 2018, 19 pages.
United States Office Action, U.S. Appl. No. 15/167,692, dated Aug. 28, 2017, 18 pages.
United States Office Action, U.S. Appl. No. 15/167,692, dated Apr. 7, 2017, 16 pages.

… (1) …

REFLECTIVE DISPLAY DEVICE

CROSS REFERENCE TO RELATED APPLICATIONS

This application is a continuation application of U.S. patent application Ser. No. 15/167,692, filed on May 27, 2016, which claims the benefit of Republic of Korea Patent Application No. 10-2015-0178962 filed on Dec. 15, 2015, all of which are hereby incorporated by reference for all purposes as if fully set forth herein.

BACKGROUND OF THE INVENTION

Field of the Invention

The present invention relates to a reflective display device.

Discussion of the Related Art

Recently, with the advancement of the information age, display technology for processing and displaying large amount of information have rapidly developed. In response to this trend, various display devices have been introduced and spotlighted. Detailed examples of the display devices include liquid crystal display (LCD) devices, plasma display panel (PDP) devices, field emission display (FED) devices, electroluminescence display (ELD) devices, and organic light emitting display (OLED) devices.

Recently, the display devices have had properties of a thin profile, a light weight, and low power consumption, whereby application fields of the display devices have continuously increased. Particularly, the display device has been used as one of the user interfaces in most electronic devices and mobile devices.

Also, recently, many studies have been actively made for a reflective display device categorized into a reflective area and a display area. A reflective display device may be used as a mirror by reflecting light when an image is not displayed and serves as a general display device when an image is displayed.

In this case, however, since reflectance is not controlled while high reflectance is always maintained, the reflective display device cannot be properly operated as a display device because a contrast ratio is low when an image is displayed.

FIG. 1 is a brief view illustrating a conventional reflective display device.

As shown in FIG. 1, the conventional reflective display device includes a display area and a reflective area.

A thin film transistor T is formed on the display area, wherein the thin film transistor includes a first substrate 10, an active layer 11, a gate insulator 12, a gate electrode 13, a dielectric inter-layer 14, a source electrode 15, and a drain electrode 16, and a passivation layer 20 and a planarization layer 30 are formed on the thin film transistor T in due order.

An anode electrode 40 and an auxiliary electrode 50 are formed on the planarization layer 30. The auxiliary electrode serves to reduce resistance of a cathode electrode 80 which will be described later. A bank 60 is formed on the anode electrode 40 and the auxiliary electrode 50 to define a pixel area, an organic light emitting layer 70 is formed in the pixel area defined by the bank 60, and the cathode electrode 80 is formed on the organic light emitting layer 70.

A black matrix 91 and a color filter 92 are formed on a second substrate 90.

A reflective metal 93 is arranged on a reflective area of the second substrate 90. When an image is not displayed on the display area, the reflective metal 93 may serve as a mirror by reflecting light.

When Ag, Ag-alloys, and Al are used as the reflective metal 93 for high reflectance, however, a defect may occur due to low adhesion to the second substrate 90. Also, if an adhesive layer is added between the second substrate 90 and the reflective metal 93 in order to solve this problem, a color of reflected light might be changed due to thickness of the adhesive layer.

The related art described above is based on technical information owned by the inventor to derive the present invention or gained through the process of deriving the present invention, and is not necessarily known to the public prior to filing of the application of the present invention.

SUMMARY OF THE INVENTION

Embodiments relate to a display device that includes a first substrate and a second substrate having a first surface facing the first substrate. The first substrate and the second substrate are divided into a plurality of display areas and a plurality of reflective areas. A plurality of thin film transistors are on the first substrate in the plurality of display areas. A plurality of display elements are in between the first substrate and the second substrate, and are configured to be driven by the plurality of thin film transistors. A plurality of optical layers is on the first surface of the second substrate in the plurality of reflective areas. The plurality of optical layers is configured to produce light of a first color from light of a second color incident upon the optical layers. A plurality of reflective layers is on the optical layers and is configured to reflect light passing through the optical layers towards the optical layers.

In one embodiment, a display area and a reflective area adjacent to the display area define a pixel region.

In one embodiment, the optical layers produce the light of the first color from the light of the second color by a cavity effect of the optical layers.

In one embodiment, an adhesion between the optical layers and the first surface of the second substrate is stronger than an adhesion between the reflective layers and the first surface of the second substrate.

In one embodiment, the optical layers are made of a transparent conductive oxide (TCO) material.

In one embodiment, when the second color is a white color, the first color is a blue color when a thickness of the optical layers is between 55 nm and 100 nm, the first color is a red color when a thickness of the optical layers is between 175 nm and 200 nm, and the first color is a green color when a thickness of the optical layers is between 225 and 275 nm.

In one embodiment, the reflective layers are made of at least one of Ag, Ag-alloys, Al, and AlNd.

In one embodiment, the display elements include planarization layers on the plurality of thin film transistors, anode electrodes on the planarization layers in the display areas, and auxiliary electrodes on the planarization layers. The auxiliary electrodes and the anode electrodes are separated by a predetermined distance. Bank layers partially cover the anode electrodes and the auxiliary electrodes. The bank layers expose portions of the anode electrodes and portions of the auxiliary electrodes. Barriers are on the exposed portions of the auxiliary electrodes, and the barriers are separated from the bank layers. At least a portion of the barriers have a width larger than a width of the exposed portions of the auxiliary electrodes. Organic light emitting layers are on the exposed portions of the anodes electrode and on at least a portion of a top surface of the barriers. Cathode electrodes are on the organic light emitting layers and in contact with the exposed portions of the auxiliary electrodes.

In one embodiment, the display elements include a plurality of color filters on the second substrate in the plurality of display areas.

In one embodiment, a first subset of optical layers has a first thickness that is different from a second thickness of a second subset of optical layers.

In one embodiment, supplemental optical layers are on a subset of the reflective layers.

In one embodiment, an area of the reflective areas is larger than an area of the display areas.

Embodiments also relate to a method of manufacturing a display device. Thin film transistors are provided on a first substrate. A plurality of display elements are provided on at least on or over the thin film transistors. The display elements are configured to be driven by the thin film transistors. Optical layers are provided in selected regions of a second substrate to produce light of a first color different from light of a second color incident upon the optical layers. Reflective layers are provided on the optical layers in the selected regions to reflect light passing through the optical layers towards the optical layers. The second substrate is placed over the first substrate such that at least parts of the display elements are located between the first substrate and the second substrate without being blocked by the optical layers and the reflective layers.

In one embodiment, a plurality of color filters of the display elements is provided on the second substrate in at least a plurality of portions outside the selected regions.

In one embodiment, the optical layers produce the light of the first color from the light of the second color by a cavity effect of the optical layers.

In one embodiment, an adhesion between the optical layers and the first surface of the second substrate is stronger than an adhesion between the reflective layers and the first surface of the second substrate.

In one embodiment, the optical layers are made of a transparent conductive oxide (TCO) material.

In one embodiment, when the second color is a white color, the first color is a blue color when a thickness of the optical layers is between 55 nm and 100 nm, the first color is a red color when a thickness of the optical layers is between 175 nm and 200 nm, and the first color is a green color when a thickness of the optical layers is between 225 and 275 nm.

In one embodiment, the reflective layers are made of at least one of Ag, Ag-alloys, Al, and AlNd.

In one embodiment, an optical layer is deposited on the first surface of the second substrate, a reflective layer is deposited on the optical layer, and photoresist patterns are deposited on the reflective layer in the selected regions of the second substrate, and at least portions of the optical layer and the reflective layer exposed by the photoresist patterns are removed to provide the optical layers and the reflective layers in the selected regions of the second substrate.

In one embodiment, a first subset of optical layers has a first thickness that is different from a second thickness of a second subset of optical layers.

In one embodiment, supplemental optical layers are formed on a subset of the reflective layers.

In one embodiment, an area of the reflective areas is larger than an area of the display areas.

Embodiments also relate to a display device including a plurality of pixel regions. Each of the pixel regions includes a display area and a reflective area. The display area includes a first portion of a first substrate, a first portion of a second substrate aligned with the first portion of the first substrate, a thin film transistor on the first portion of the first substrate, and a display element between the first portion of the first substrate and the first portion of the second substrate. The display element is configured to be driven by the thin film transistor. The reflective area is adjacent to the display area and includes a second portion of the first substrate, a second portion of the second substrate aligned with the second portion of the first substrate, and an optical layer on a first surface of the second portion of the second substrate facing the first substrate. The optical layer is configured to produce light of a first color from light of a second color incident upon the optical layer. A reflective layer is on the optical layer, and the reflective layer is configured to reflect light passing through the optical layer towards the optical layer.

In one embodiment, the optical layer produces the light of the first color from the light of the second color by a cavity effect of the optical layer.

In one embodiment, an adhesion between the optical layer and the first surface of the second substrate is stronger than an adhesion between the reflective layer and the first surface of the second substrate.

In one embodiment, the optical layer is made of a transparent conductive oxide (TCO) material.

In one embodiment, when the second color is a white color, the first color is a blue color when a thickness of the optical layer is between 55 nm and 100 nm, the first color is a red color when a thickness of the optical layer is between 175 nm and 200 nm, and the first color is a green color when a thickness of the optical layer is between 225 and 275 nm.

In one embodiment, the reflective layer is made of at least one of Ag, Ag-alloys, Al, and AlNd.

In one embodiment, a color filter is on the first portion of the second substrate.

In one embodiment, optical layers in a first subset of pixel regions have a first thickness that is different from a second thickness of optical layers in a second subset of pixel regions.

In one embodiment, the reflective areas of a subset of pixel regions further include a supplemental optical layer on the reflective layer.

In one embodiment, an area of the reflective area is larger than an area of the display area.

Embodiments also relate to a display device including a plurality of pixel regions. Each pixel region includes a first substrate, a second substrate having a first surface facing the first substrate. The first substrate and the second substrate are divided into a display area and a reflective area. A thin film transistor is on the display area of the first substrate. A display element is placed between the first substrate and the second substrate, and the display element is configured to be driven by the thin film transistor. An optical layer is on the first surface of the second substrate in the reflective area, and the optical layer is configured to produce light of a first color from light of a second color incident upon the optical layer. A reflective layer is on the optical layer, and the reflective layer is configured to reflect light passing through the optical layer towards the optical layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
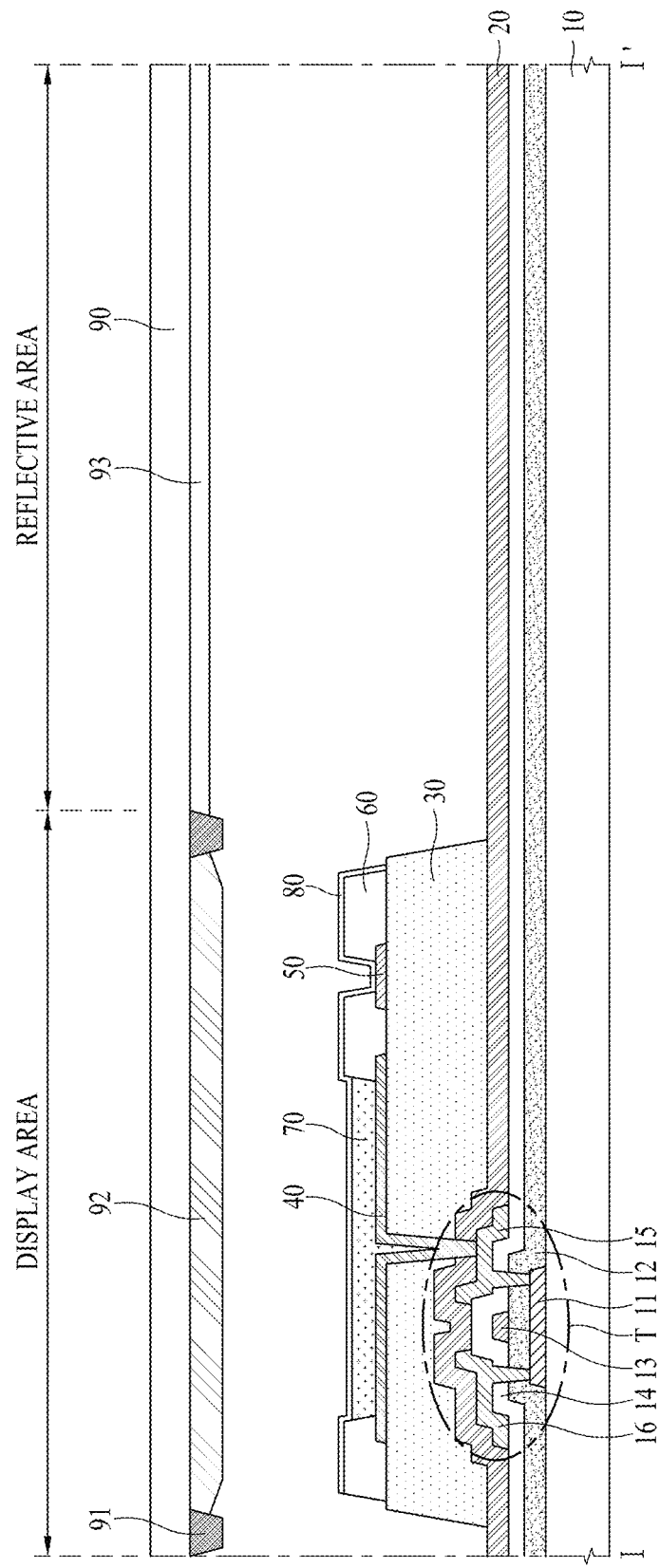
FIG. 1 is a brief cross-sectional view illustrating a conventional reflective display device.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout the specification. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as 'after~', 'subsequent~' 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, the preferred embodiments of the present invention will be described in detail with reference to the accompanying drawings.

Figure 2:
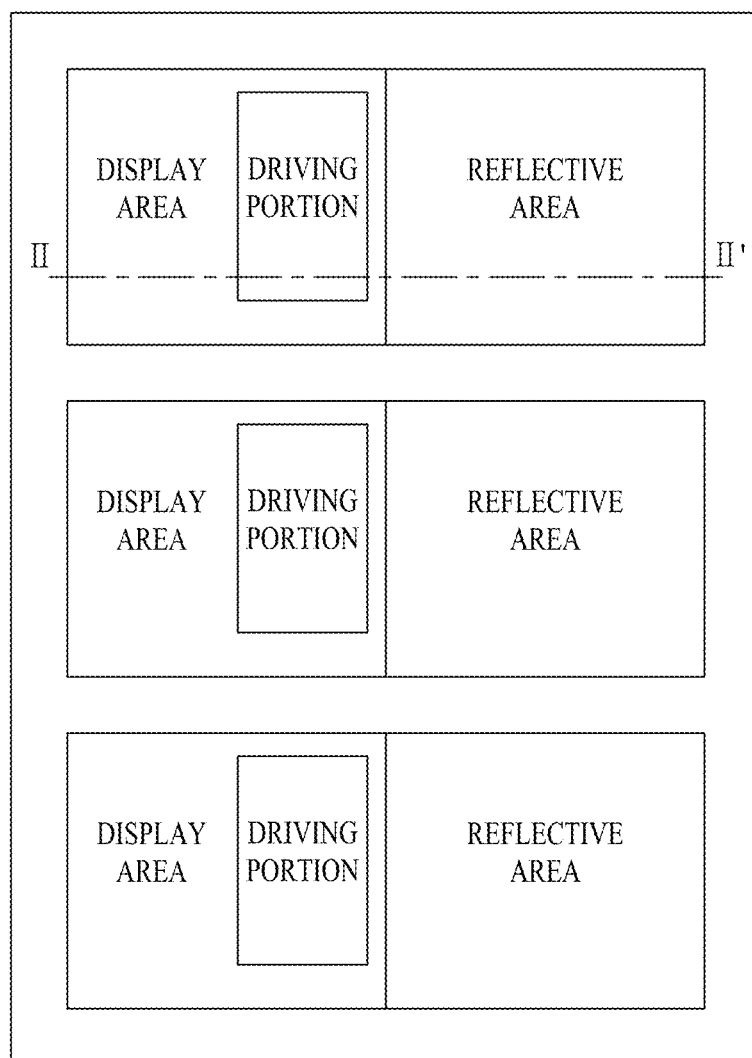
FIG. 2 is a front view illustrating one pixel region of a reflective display device according to one embodiment.
Figure 3:
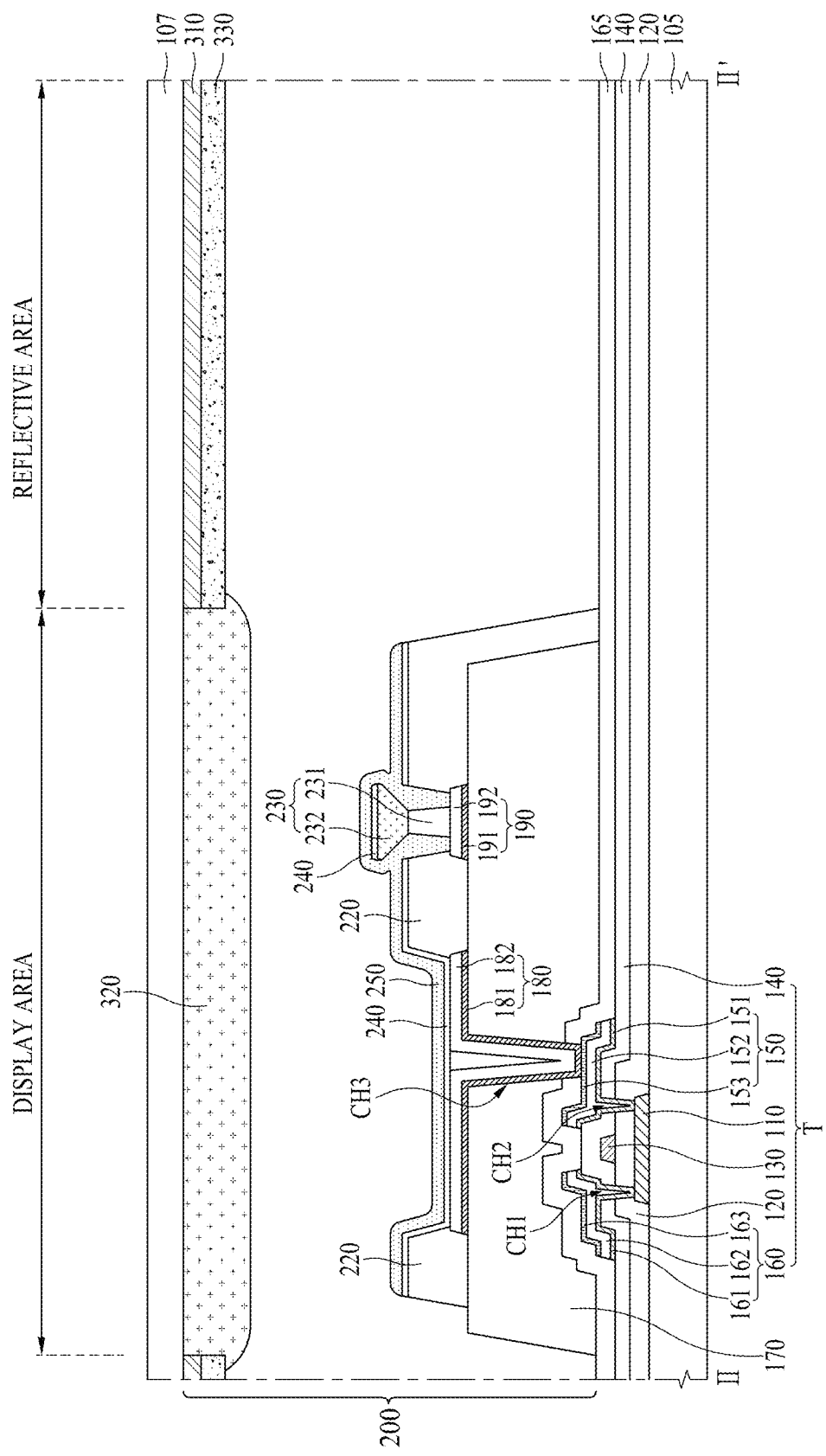
FIG. 3 is a cross-sectional view illustrating a reflective display device according to one embodiment.

FIG. 2 is a front view illustrating one pixel region of a reflective display device according to one embodiment, and FIG. 3 is a cross-sectional view illustrating a reflective display device according to one embodiment.

Referring to FIGS. 2 and 3, the reflective display device according to one embodiment includes first and the second substrates 105 and 107 facing each other, each of which includes a display area and a reflective area. The display area is provided with a display element 200, and the reflective area of the second substrate 107 includes a reflective layer 330 and an optical layer 310. The display element 200 may include an anode 180, an organic light emitting layer 240, a cathode 250, an auxiliary electrode 190, and a color filter layer 320. The display area will first be described, which will be followed by description of the reflective area.

A thin film transistor T, a passivation layer 165, a planarization layer 170, an anode electrode 180, an auxiliary electrode 190, a bank 220, a barrier 230, an organic light emitting layer 240, and a cathode electrode 250 are formed on the first substrate 105 in the display area. A color filter layer 320 is formed on the display area of the second substrate 107.

At least one of the first substrate 105 and the second substrate 107 may be a transparent substrate depending on a direction of light which is emitted. For example, the second substrate 107 may be a transparent plastic film. For example, the substrate 105 may be, but not limited to, a sheet or film that includes Cellulose resin such as TAC (triacetyl cellulose) or DAC (diacetyl cellulose), COP (cyclo olefin polymer) such as Norbornene derivatives, COC (cyclo olefin copolymer), acrylic resin such as PMMA (polymethylmethacrylate), polyolefin such as PC (polycarbonate), PE (polyethylene), and PP (polypropylene), PVA (polyvinyl alcohol), polyester such as PES (poly ether sulfone), PEEK (polyetheretherketone), PEI (polyetherimide), PEN (polyethylenenaphthalate) and PET (polyethyleneterephthalate), PI (polyimide), PSF (polysulfone), or fluoride resin.

The thin film transistor drives the display element 200 to emit light and includes an active layer 110, a gate insulating film 120, a gate electrode 130, a dielectric inter-layer 140, a source electrode 150, and a drain electrode 160.

The active layer 110 is formed on the substrate 105 to overlap the gate electrode 130. The active layer 110 may be made of silicon-based semiconductor material and may be also made of oxide based semiconductor material.

The gate insulating film 120 is formed on the active layer 110. The gate insulating film 120 serves to insulate the active layer 110 from the gate electrode 130. The gate insulating film 120 may be made of, but is not limited to, inorganic insulating material, for example, a silicon oxide ($SiO_X$) film, a silicon nitride ($SiN_X$) film, or a multi-layer of $SiO_X$ and $SiN_X$.

The gate electrode 130 is formed on the gate insulating film 120. The gate electrode 130 is formed to overlap the active layer 110 by interposing the gate insulating film 120 therebetween.

The dielectric inter-layer 140 is formed on the gate electrode 130. The dielectric inter-layer 140 may be formed of, but not limited to, inorganic insulating material, such as for example, a silicon oxide ($SiO_X$) film, a silicon nitride ($SiN_X$) film, or a multi-layered film of $SiO_X$ and $SiN_X$.

The source electrode 150 and the drain electrode 160 are formed on the dielectric inter-layer 140 to face each other. The aforementioned gate insulating film 120 and the aforementioned dielectric inter-layer 140 are provided with a first contact hole CH1 and a second contact hole CH2, wherein the first contact hole CH1 exposes one end area of the active layer 110, and the second contact hole CH2 exposes the other end area of the active layer 110. The source electrode 150 is connected with the other end area of the active layer 110 through the second contact hole CH2, and the drain electrode 160 is connected with the one end area of the active layer 110 through the first contact hole CH1. Also, the source electrode 150 may include a lower source electrode 151, a central source electrode 152, and an upper source electrode 153.

The lower source electrode 151 is formed between the dielectric inter-layer 140 and the central source electrode 152 and may serve to improve adhesion between the dielectric inter-layer 140 and the central source electrode 152. Also, the lower source electrode 151 protects the lower surface of the central source electrode 152 to prevent the lower surface of the central source electrode 152 from being corroded.

The central source electrode 152 is formed between the lower source electrode 151 and the upper source electrode 153. The central source electrode 152 may be made of, but not necessarily limited to, copper (Cu), which is a metal with low resistance. The upper source electrode 153 is formed on the upper surface of the central source electrode 152 and therefore may prevent the upper surface of the central source electrode 152 from being corroded.

In one embodiment, the lower source electrode 151 and the upper source electrode 153 may be made of, but not necessarily limited to, Mo, Ti, MoTi, or indium tin oxide (ITO), and the central source electrode 152 may be made of, but not necessarily limited to, Cu or Al. In one embodiment, when the central source electrode 152 is made of Cu, the lower source electrode 151 is made of MoTi or ITO, and the upper source electrode 153 is made of MoTi or ITO, or may be omitted. In another embodiment, when the central source electrode 152 is made of Al, the lower source electrode 151 and the upper source electrode 153 is made of Mo or Ti.

Similarly to the source electrode 150, the drain electrode 160 may include a lower drain electrode 161, a central drain electrode 162, and an upper drain electrode 163. The lower drain electrode 161, central drain electrode 162, and upper drain electrode 163 may be configured similarly or identically to the lower source electrode 151, central source electrode 152, and upper source electrode 153. To avoid repeated description, the same description will be omitted.

The aforementioned thin film transistor layer T may be modified to various structures known to those skilled in the art without being limited to the above structure as shown. For example, although the thin film transistor T is formed in a top gate structure in the drawing in which the gate electrode 130 is formed above the active layer 110, the thin film transistor T may be formed in a bottom gate structure in which the gate electrode 130 is formed below the active layer 110.

The passivation layer 165 is formed on the thin film transistor layer T, more specifically on the source electrodes 150 and the drain electrodes 160. The passivation layer 165 serves to protect the thin film transistor layer T, and may be made of, but not limited to, an inorganic insulating material, for example, silicon oxide ($SiO_X$) or silicon nitride ($SiN_X$).

The planarization layer 170 is formed on the passivation layer 165. The planarization layer 170 serves to planarize the upper portion of the substrate 105 provided with the thin film transistor layer T. The planarization layer 170 may be made of, but not limited to, an organic insulating material such as acrylic resin, epoxy resin, phenolic resin, polyamide resin, and polyimide resin.

The anode electrode 180 and the auxiliary electrode 190 are formed on the planarization layer 170. That is, the anode electrode 180 and the auxiliary electrode 190 are formed on the same layer as each other. The aforementioned passivation layer 165 and the aforementioned planarization layer 170 are provided with a third contact hole CH3 that exposes the source electrode 150, and the source electrode 150 and the anode electrode 180 are connected with each other through the third contact hole CH3. The anode electrode 180 may include a lower anode electrode 181 and an upper anode electrode 182, and the auxiliary electrode 190 may include a lower auxiliary electrode 191 and an upper auxiliary electrode 192.

The bank 220 is formed on the anode electrode 180 and the auxiliary electrode 190. The bank 220 may partially cover the anode electrode 180 and the auxiliary electrode 190. For example, the bank 220 is formed on one side and the other side opposite the one side of the anode electrode 180 while exposing an upper surface of the anode electrode 180. The bank 220 may define an area where image is displayed, by exposing the upper surface of the anode 180.

The bank 220 is also formed on one side and the other side opposite the one side of the auxiliary electrode 190 while exposing an upper surface of the auxiliary electrode 190. The bank 220 may define an electric connection space between the auxiliary electrode 190 and the cathode electrode 250 by exposing the upper surface of auxiliary electrode 190.

The barrier 230 is formed on the auxiliary electrode 190. The barrier 230 is spaced apart from the bank 220 at a predetermined distance, and the auxiliary electrode 190 and the cathode electrode 250 are electrically connected with each other through the space between the barrier 230 and the bank 220.

If the barrier 230 is not formed, in order for the upper surface of the auxiliary electrode 190 to not be covered by the organic light emitting layer 240, a mask pattern covering the upper surface of the auxiliary electrode 190 is required when the organic light emitting layer 240 is deposited. However, if the barrier 230 is formed, the upper surface of the barrier 230 serves as an eaves when the organic light emitting layer 240 is deposited. Thus, the organic light emitting layer is not deposited below the eaves, and therefore a mask pattern covering the upper surface of the auxiliary electrode 190 is not required.

The barrier 230 is formed to have an upper surface wider than its lower surface. The barrier 230 may include a first barrier 231 and a second barrier 232, wherein the first barrier 231 is lower than the second barrier 231. In addition, at least a portion of the barrier 230 may have a width that is equal to or larger than a width of the upper surface of the auxiliary electrode 190 exposed by the bank 220.

The organic light emitting layer 240 is formed on the anode electrode 180. The organic light emitting layer 240 may include a hole injecting layer, a hole transporting layer, an emitting layer, an electron transporting layer, and an electron injecting layer. The organic light emitting layer 240 may be modified to various structures known to those skilled in the art.

The cathode electrode 250 is formed on the organic light emitting layer 240. Since the cathode electrode 250 is formed on a surface or direction where light is emitted, the cathode electrode 250 is made of a transparent conductive material. Since the cathode electrode 250 is made of a transparent conductive material, it has high resistance. Therefore, to reduce resistance of the cathode electrode 250, the cathode electrode 250 is connected with the auxiliary electrode 190. That is, the cathode electrode 250 is connected with the auxiliary electrode 190 through the space between the barrier 230 and the bank 220. Since the cathode electrode 250 may be formed through a deposition process, such as sputtering, which does not have good linearity of a deposition material, the cathode electrode 250 may be deposited on the space between the barrier 230 and the bank 220 during the deposition process of the cathode electrode 250.

Although not shown, an encapsulation layer may additionally be formed on the cathode electrode 250 to prevent water permeation from occurring.

The color filter layer 320 is formed on the upper surface of the second substrate 107 to correspond to each pixel area or display area of the second substrate. As described further below, the pixel area may be defined by the boundaries of the reflective layer 330. In this case, the color filter layer 320 may be comprised of red, green, and blue color filter layers corresponding to each pixel area. At this time, each of the red, green, and blue color filter layers are formed on the entirety of the display areas.

Also, unlike the conventional reflective display device, a black matrix which is formed on both ends of the color filter layer 320 and that may define a pixel area is omitted in the reflective display device according to one embodiment. As shown, a reflective layer 330, which will be described later, may replace the role of the black matrix.

Hereinafter, a reflective area including an optical layer 310 and a reflective layer 330, as shown in FIG. 3, will be described. The description of the repeated structure of the display area will be omitted in order to avoid the repeated description.

The reflective display device according to one embodiment further includes an optical layer 310 and a reflective layer 330 on the upper surface of the second substrate 107 in the reflective area. The upper surface of the second substrate 107 may face the first substrate 105.

The reflective layer 330 is a layer reflecting external light and may be made of highly reflective metal including, but not limited to, Ag, Ag-alloys, AlNd, and Al. Such a reflective layer 330 may be operated by a reflective mode which is capable of reflecting external light off of a surface of the reflective layer 330 and allows a user to see reflected image when an image is not displayed. For example, the reflective layer 330 may be capable of reflecting external light off of a surface of the reflective layer 330 facing the optical layer 310. Also, even the display area is operated in a display mode where the display area displays images, the reflective mode and a display mode may be operated at the same time by reflecting external light.

When the reflective layer 330 is made of metal, the optical layer 310 is arranged between the reflective layer 330 and the second substrate 107 to improve adhesion with the second substrate 107. In other words, adhesion between the second substrate 107 and the optical layer 310 is stronger than adhesion between the second substrate 107 and the reflective layer 330, and adhesion between the optical layer 310 and the reflective layer 330 is stronger than adhesion between the second substrate 107 and the reflective layer 330. Therefore, adhesion between the second substrate 107 and the reflective layer 330 can be improved.

Such an optical layer 310 may be made of, but is not limited to, a transparent electrode based material. For example, the optical layer 310 may be made of indium tin oxide (ITO) or indium zinc oxide (IZO).

Light of a first color is produced from the optical layer 310 when light of a second color incident on a surface of the optical layer 310 passes through the optical layer 310. For example, the optical layer 310 may control the spectrum or color of light reflected from the reflective layer 330. In general, a transparent electrode such as ITO or IZO generates a weak cavity effect that changes spectrum or color of light depending on the thickness of the layer. Therefore, when external light is entered and is reflected from a surface of the reflective layer 330, the color of reflected light is changed by passing through the optical layer 310. Such color change depends on the thickness of the optical layer 310, which will be described in more detail in reference to FIGS. 4 and 5.

Figure 4:
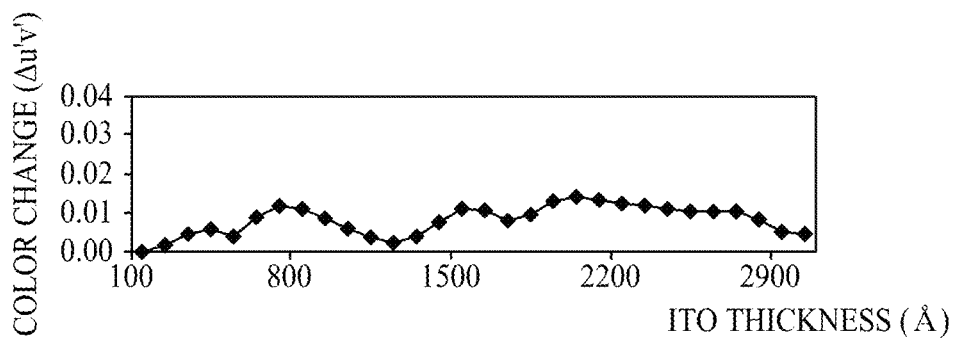
FIG. 4 is a plot illustrating a color coordinate deviation Δu'v' of u'v' in the color space of CIELu'v' depending on a thickness of an optical layer formed of indium tin oxide (ITO).
Figure 5:
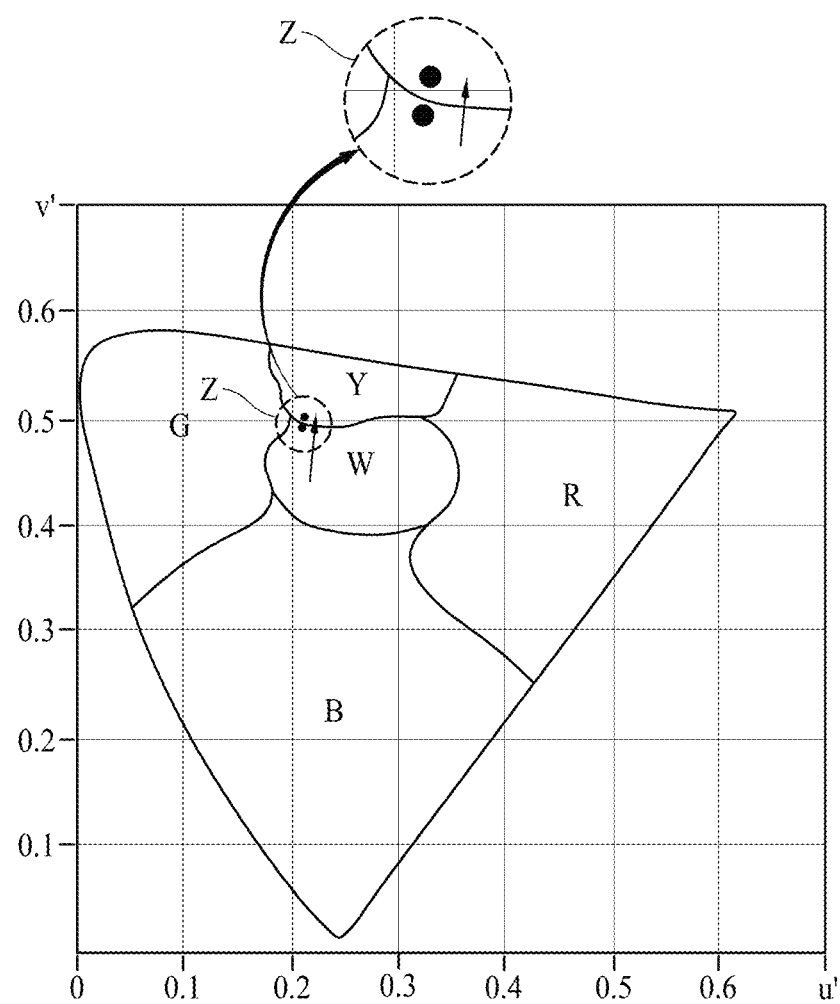
FIG. 5 is a view illustrating a color space of CIELu'v'.

FIG. 4 is a brief view illustrating color coordinate deviation Δu'v' of u'v' in the color space of CIELu'v' depending on a thickness of an optical layer, and FIG. 5 is a view illustrating a color space of CIELu'v'.

Referring to FIGS. 4 and 5 together, when a thickness of the optical layer 310 is changed, as shown in the horizontal axis of FIG. 4, in the reflective display device according to one embodiment, a color coordinate deviation Δu'v' is generated, as shown in the vertical axis of FIG. 4. In general, if a color coordinate deviation Δu'v' reaches 0.01 or more, a color change may be perceived. However, the color coordinate deviation Δu'v' ranges from 0.001 to 0.02 depending on the thickness of the optical layer 310. Accordingly, light of a white color, which is reflected through the reflective layer 330, may change to light of a yellow color due to the color coordinate deviation Δu'v' while passing through the optical layer 310, as shown in FIG. 5.

As shown in FIG. 5, the color of light may be classified according to color region in a color space it falls under. For example, as shown in FIG. 5, a color of light may be classified into red ("R"), blue ("B"), green ("G"), yellow ("Y"), and white ("W") depending on which color region in the CIELu'v' color space the light falls under. Light of a white color may be defined to have CIELu'v' coordinates in a range of u' (0.1965-0.1975) and v' (0.4685-0.4720), light of a red color may be defined to have CIELu'v' coordinates in a range of u' (0.2010-0.2045) and v' (0.4650-0.4720), light of a green color may be defined to have CIELu'v' coordinates in a range of u' (0.1925-0.1940) and v' (0.4645-0.4780), and light of a blue color may be defined to have CIELu'v' coordinates in a range of u' (0.1915-0.1930) and v' (0.4570-0.4580), and light of a yellow color may be defined to have CIELu'v' coordinates in a range of u' (0.1990-0.2010) and v' (0.4735-0.4790). However, the color coordinate deviation Δu'v' shown in FIG. 5 is only exemplary and may be changed depending on the thickness of the optical layer 310.

For example, light of a white color, which is reflected by the reflective layer 330, may be changed to light of a blue color due to the color coordinate deviation Δu'v' while passing through the optical layer 310.

Also, light of a white color, which is reflected through the reflective layer 330, may be changed to light of a green color due to the color coordinate deviation Δu'v' while passing through the optical layer 310.

Therefore, the reflective display device according to the embodiment can change a color of reflected light by controlling the thickness of the optical layer 310. In other words, the light reflected by the reflective layer 330 may be mixed while passing through the optical layer 310, whereby a color of the reflected light may be controlled depending on the thickness of the optical layer 310. In one embodiment, the thickness of the optical layers may be the same across each pixel region. In another embodiment, the thickness of the optical layers may be different between pixel regions. For example, a first subset of optical layers in the reflective display device may have a first thickness, and a second subset of optical layer in the device may have a second thickness that is different from the first thickness.

Figure 6:
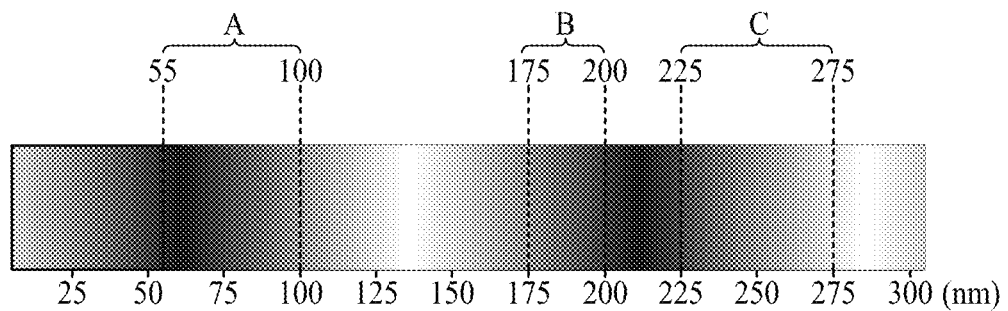
FIG. 6 is a view illustrating a color change of reflected light depending on a thickness change of an optical layer.

FIG. 6 is a view illustrating a color change of reflected light depending on a thickness change of the optical layer 310.

Referring to FIG. 6, the optical layer 310 may produce light with a blue color when its thickness is between 55 nm and 100 nm (area A), reflect light with a red color when its thickness is between 175 nm and 200 nm (area B), and reflect light with a green color when its thickness is between 225 nm and 275 nm (area C).

Therefore, if the thickness of the optical layer 310 is controlled as above, a color of the reflected light can be selected. For example, if external light entering the reflective area of the reflective display device according to the embodiment is white light and the reflected light needs to be a blue color, the thickness of the optical layer 310 can be set between 55 nm and 100 nm. Also, if external light entering the reflective area of the reflective display device according to the embodiment is white light and the reflected light needs to be a red color, the thickness of the optical layer 310 can be set between 175 nm and 200 nm. Also, if external light entering the reflective area of the reflective display device according to the embodiment is white light and the reflected light needs to be a green color, the thickness of the optical layer 310 can be set between 225 nm and 275 nm. However, the color of light can be selected in a visible light spectrum area without limitation to the above examples.

Hereinafter, a method for manufacturing a second substrate 107 disposed on a reflective area of a reflective display device according to one embodiment will be described with reference to FIGS. 7A through 7F.

Figure 7A:
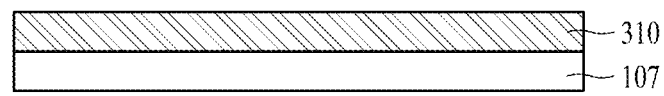
FIGS. 7A through 7F are views illustrating a manufacturing process of a second substrate including an optical layer in a reflective display device according to one embodiment.

FIG. 7A illustrates a step of forming the optical layer 310 on the upper surface of the second substrate 107. The second substrate 107 may be a transparent or opaque plastic substrate depending on an emitting direction of the reflective display device. For example, the second substrate 107 may be cellulose resin such as TAC (triacetyl cellulose) or DAC (diacetyl cellulose), COP (cyclo olefin polymer) such as norbornene derivatives, COC (cyclo olefin copolymer), and acrylic resin such as PMMA (poly(methylmethacrylate)), etc.

The optical layer 310 may be made of, but is not limited to, a transparent electrode based material such as transparent conductive oxide (TCO) based material. For example, the optical layer 310 may be made of ITO or IZO.

Figure 7B:
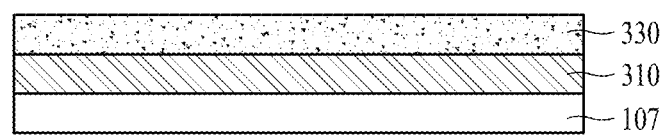

Next, FIG. 7B illustrates a step of forming the reflective layer 330 on the upper surface of the optical layer 310. The reflective layer 330 is a layer reflecting external light and may be made of a high reflective metal such as, but is not limited to, Ag, Ag-alloys, Al, and AlNd, etc.

Figure 7C:
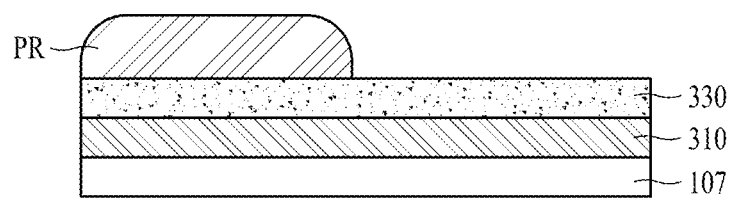

Next, FIG. 7C illustrates a step of forming a photoresist pattern. The photoresist pattern is formed on one surface of the reflective layer 330. Such a photoresist pattern can be obtained through a half-tone mask process.

Figure 7D:
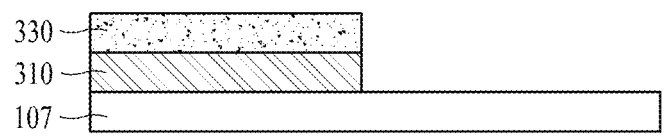

Next, FIG. 7D illustrates a step of partially removing the optical layer 310 and the reflective layer 330, which are formed on one surface of the second substrate 107 using the photoresist pattern as a mask, on which the photoresist pattern is not formed.

Figure 7E:
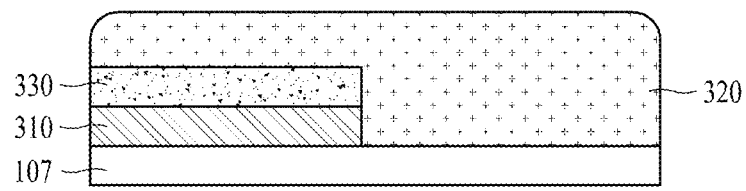
Figure 7F:
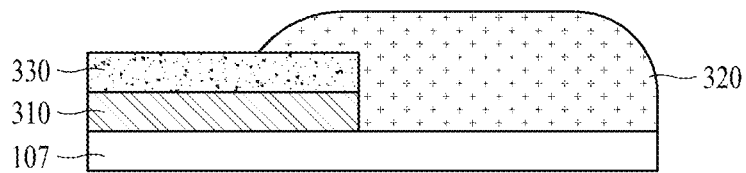

Next, FIGS. 7E and 7F illustrate steps of forming a color filter layer 320. First of all, the color filter layer 320 is formed on the entire surface of the second substrate 107. Afterwards, a part of the color filter layer 320, which corresponds to the reflective area, is removed, whereby the reflective layer 330 is exposed. The color filter layer 320 may be a red, green, and/or blue color filter and positioned corresponding to each pixel area. At this time, each of red, green, blue color filter layers is formed on all of the display areas. As described above, in the reflective display device according to one embodiment, a black matrix formed on both ends of the color filter layer 320 to define pixel areas may be omitted, unlike the conventional reflective display device. The reflective layer 330 arranged on the reflective area may serve as a black matrix to define pixel areas. For example, an area of the reflective display device that does not have a reflective layer 330 may correspond to the pixel area.

Figure 8:
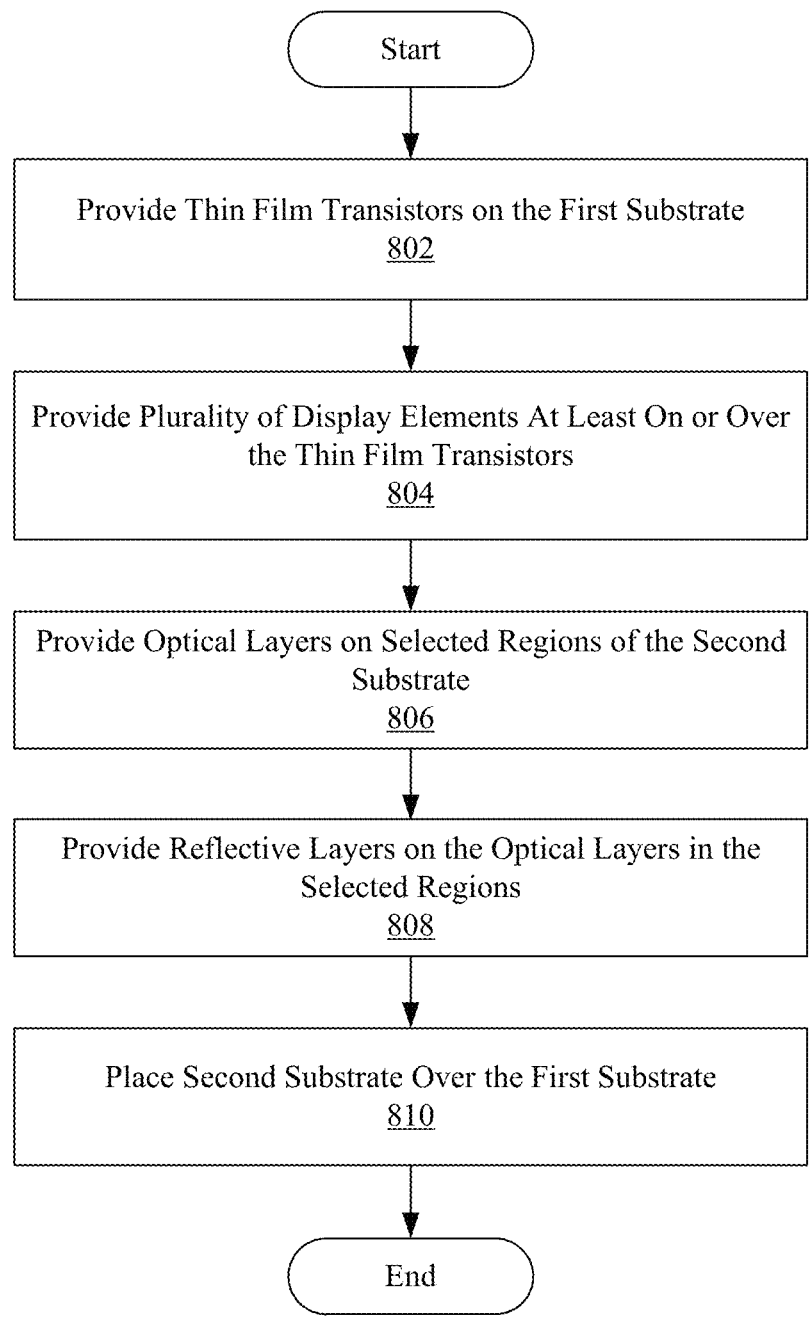
FIG. 8 is a flowchart illustrating a method of manufacturing a reflective display device, according to one embodiment.

FIG. 8 is a flowchart illustrating a method of forming a reflective display device, according to one embodiment.

Thin film transistors are provided 802 on the first substrate. A plurality of display elements is provided 804 at least on or over the thin film transistors. Each of the display elements are connected to a corresponding one of the thin film transistors. Optical layers are provided 806 on selected regions of the second substrate to produce light of a first color from light of a second color incident upon the optical layers. Reflective layers are provided 808 on the optical layers in the select regions to reflect light passing through the optical layer towards the optical layers. The second substrate is placed 810 over the first substrate such that at least parts of the display elements are located between the first substrate and the second substrate without being blocked by the optical layers and the reflective layers.

As described above, according to the present invention, the following advantages can be obtained.

First of all, adhesion between the substrate and the reflective layer is improved, whereby poor adhesion can be avoided.

In addition, the reflective display device that can select the color of the reflected light by controlling the thickness of the optical layer can be obtained.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device comprising:
   a first substrate;
   a second substrate having a first surface facing the first substrate, the first substrate and the second substrate divided into a plurality of pixel regions, wherein each pixel region is divided into a display area and a reflective area;
   a passivation layer in the display area and the reflective area;
   a planarization layer on the passivation layer in the display area;
   a color filter in the display area;
   an anode electrode on the planarization layer in the display area;
   an organic light emitting layer on the anode electrode;
   a cathode electrode on the organic light emitting layer; and
   a reflective layer in the reflective area,
   wherein in the display area, the color filter faces the cathode electrode, and in the reflective area, the reflective layer faces the passivation layer,
   wherein the anode electrode, the organic light emitting layer, and the cathode electrode are disposed on the planarization layer in the display area,
   wherein an optical layer is on the first surface of the second substrate in the reflective area and the reflective layer is on the optical layer,
   wherein the optical layer is configured to produce light of a first color from light of a second color incident upon the optical layer, and
   wherein the reflective layer is configured to reflect light passing through the optical layer towards the optical layer.

2. The display device of claim 1, wherein the reflective area is adjacent to the display area.

3. The display device of claim 1, wherein the optical layer is made of a transparent conductive material.

4. The display device of claim 1, wherein when the second color is a white color, the first color is a blue color when a thickness of the optical layer is between 55 nm and 100 nm, the first color is a red color when a thickness of the optical layer is between 175 nm and 200 nm, and the first color is a green color when a thickness of the optical layer is between 225 and 275 nm.

5. The display device of claim 1, wherein an adhesion between the optical layer and the first surface of the second substrate is stronger than an adhesion between the reflective layer and the first surface of the second substrate.

6. The display device of claim 1, wherein the color filter contacts a side surface of the optical layer and a side surface of the reflective layer, and covers at least a surface of the reflective layer facing the first substrate.

7. The display device of claim 1, wherein the optical layer is formed of at least one of indium tin oxide (ITO) or indium zinc oxide (IZO).

8. The display device of claim 1, wherein a first subset of optical layers in the plurality of pixel regions has a first thickness that is different from a second thickness of a second subset of optical layers in the plurality of pixel regions.

9. The display device of claim 1, wherein the reflective layer is made of at least one of Ag, Ag-alloys, Al, and AlNd.

10. The display device of claim 1, wherein an area of the reflective area is larger than an area of the display area.

11. The display device of claim 1, wherein the color filter is on the first surface of the second substrate in the display area.

12. The display device of claim 1, wherein the passivation layer is on a thin film transistor on the first substrate in the display area.

13. The display device of claim 1, wherein each of a plurality of display elements between the first substrate and the second substrate comprises:
   the color filter;
   the passivation layer;
   the planarization layer;
   the anode electrode on the planarization layer in the display area; and
   an auxiliary electrode on the planarization layer, the auxiliary electrode and the anode electrode separated by a distance.

14. The display device of claim 13, wherein a bank layer partially covers the anode electrode and the auxiliary electrode, wherein the bank layer exposes portion of the anode electrode and portion of the auxiliary electrode.

15. The display device of claim 14, wherein a barrier is on the exposed portion of the auxiliary electrode, and wherein the barrier is separated from the bank layer and at least a portion of the barrier has a width larger than a width of the exposed portion of the auxiliary electrode.

16. The display device of claim 15, wherein the organic light emitting layer is on the exposed portion of the anode electrode and on at least a portion of a top surface of the barrier.

17. The display device of claim 16, wherein the cathode electrode is on the organic light emitting layer and in contact with the exposed portion of the auxiliary electrode.

* * * * *